(12) United States Patent
Zhang

(10) Patent No.: US 9,508,395 B2
(45) Date of Patent: *Nov. 29, 2016

(54) THREE-DIMENSIONAL ONE-TIME-PROGRAMMABLE MEMORY COMPRISING OFF-DIE READ/WRITE-VOLTAGE GENERATOR

(71) Applicant: HangZhou HaiCun Information Technology Co., Ltd., HangZhou (CN)

(72) Inventor: Guobiao Zhang, Corvallis, OR (US)

(73) Assignees: HangZhou HaiCun Information Technology Co., Ltd., HangZhou, Zhejiang (CN); Guobiao Zhang, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/062,117

(22) Filed: Mar. 6, 2016

(65) Prior Publication Data

US 2016/0189754 A1     Jun. 30, 2016

Related U.S. Application Data

(63) Continuation-in-part of application No. 14/884,755, filed on Oct. 15, 2015, now Pat. No. 9,396,764, which is a continuation-in-part of application No. 14/803,104, filed on Jul. 19, 2015, now abandoned, (Continued)

(30) Foreign Application Priority Data

Feb. 8, 2016  (CN) .......................... 2016 1 0083717

(51) Int. Cl.
*G11C 5/02*    (2006.01)
*G11C 5/06*    (2006.01)

(Continued)

(52) U.S. Cl.
CPC . *G11C 5/02* (2013.01); *G11C 5/04* (2013.01); *G11C 5/06* (2013.01); *G11C 5/145* (2013.01); *G11C 5/147* (2013.01); *G11C 8/14* (2013.01); *H01L 25/0657* (2013.01); *G11C 13/0002* (2013.01); *G11C 2029/0411* (2013.01); *G11C 2213/71* (2013.01); *H01L 24/13* (2013.01); *H01L 24/16* (2013.01); *H01L 24/48* (2013.01); *H01L 24/73* (2013.01); *H01L 25/0655* (2013.01); *H01L 25/105* (2013.01); *H01L 2224/13101* (2013.01); *H01L 2224/16145* (2013.01);

(Continued)

(58) Field of Classification Search
USPC ............... 257/296, 303, 311, 314, 315, 686; 438/238, 241, 257, 258, 262, 264, 266
See application file for complete search history.

(56) References Cited

U.S. PATENT DOCUMENTS 4,404,655 A    9/1983 Naiff
4,424,579 A    1/1984 Roesner (Continued)

*Primary Examiner* — Mohammad Islam
*Assistant Examiner* — Ratisha Mehta

(57) ABSTRACT

The present invention discloses a three-dimensional one-time-programmable memory (3D-OTP) comprising an off-die read/write-voltage generator ($V_R$/$V_W$-generator). It comprises at least a 3D-array die and at least a peripheral-circuit die. At least a $V_R$/$V_W$-generator of the 3D-OTP arrays is located on the peripheral-circuit die instead of the 3D-array die. The $V_R$/$V_W$-generator generates at least a read voltage and/or a write voltage different from a supply voltage.

20 Claims, 12 Drawing Sheets

Related U.S. Application Data which is a continuation-in-part of application No. 14/636,359, filed on Mar. 3, 2015, now Pat. No. 9,123,393, which is a continuation-in-part of application No. 14/047,011, filed on Oct. 6, 2013, now Pat. No. 9,093,129, which is a continuation-in-part of application No. 13/787,787, filed on Mar. 6, 2013, now Pat. No. 8,890,300, which is a continuation-in-part of application No. 13/591,257, filed on Aug. 22, 2012, now Pat. No. 8,921,991.

(60) Provisional application No. 61/529,929, filed on Sep. 1, 2011.

(51) Int. Cl.
  *G11C 5/14* (2006.01)
  *G11C 5/04* (2006.01)
  *G11C 8/14* (2006.01)
  *G11C 13/00* (2006.01)
  *H01L 23/00* (2006.01)
  *H01L 25/065* (2006.01)
  *H01L 25/10* (2006.01)
  *G11C 29/04* (2006.01)

(52) U.S. Cl.
  CPC ............ *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06562* (2013.01); *H01L 2225/1023* (2013.01); *H01L 2225/1064* (2013.01); *H01L 2924/00014* (2013.01)

(56) References Cited

U.S. PATENT DOCUMENTS

| | | |
|---|---|---|
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,624,485 B2 | 9/2003 | Johnson |
| 6,717,222 B2 | 4/2004 | Zhang |
| 6,903,427 B2 | 6/2005 | Zhang |
| 7,386,652 B2 | 6/2008 | Zhang |
| 7,423,304 B2 | 9/2008 | Cleeves et al. |
| 7,449,376 B2 | 11/2008 | Isobe et al. |
| 7,728,391 B2 | 6/2010 | Zhang |
| 8,325,527 B2 | 12/2012 | Jin et al. |
| 8,345,479 B2 | 1/2013 | Maejima |
| 8,519,472 B2 | 8/2013 | Jeong et al. |
| 8,638,611 B2 | 1/2014 | Sim et al. |
| 8,890,300 B2 * | 11/2014 | Zhang ............... G11C 5/145 257/311 |
| 9,024,425 B2 * | 5/2015 | Zhang ............... G11C 5/02 257/311 |
| 9,093,129 B2 * | 7/2015 | Zhang ............... G11C 5/02 |
| 2007/0252153 A1 | 11/2007 | Koyama |
| 2008/0130342 A1 | 6/2008 | Zhang |
| 2008/0159722 A1 | 7/2008 | Zhang |
| 2009/0073795 A1 | 3/2009 | Pyeon |
| 2010/0208503 A1 | 8/2010 | Kuo |
| 2011/0298037 A1 | 12/2011 | Choe et al. |
| 2012/0155168 A1 | 6/2012 | Kim et al. |
| 2012/0218817 A1 | 8/2012 | Kang et al. |
| 2013/0003480 A1 | 1/2013 | D'Abreu et al. |
| 2013/0126957 A1 | 5/2013 | Higashitani et al. |
| 2013/0151760 A1 | 6/2013 | Cho et al. |
| 2013/0258740 A1 * | 10/2013 | Zhang ............... G11C 5/02 365/51 |
| 2014/0036566 A1 * | 2/2014 | Zhang ............... G11C 5/02 365/63 |
| 2014/0063938 A1 | 3/2014 | Oh et al. |
| 2015/0269970 A1 * | 9/2015 | Zhang ............... G11C 8/14 365/51 |
| 2016/0035394 A1 * | 2/2016 | Zhang ............... G11C 5/02 257/777 |

* cited by examiner

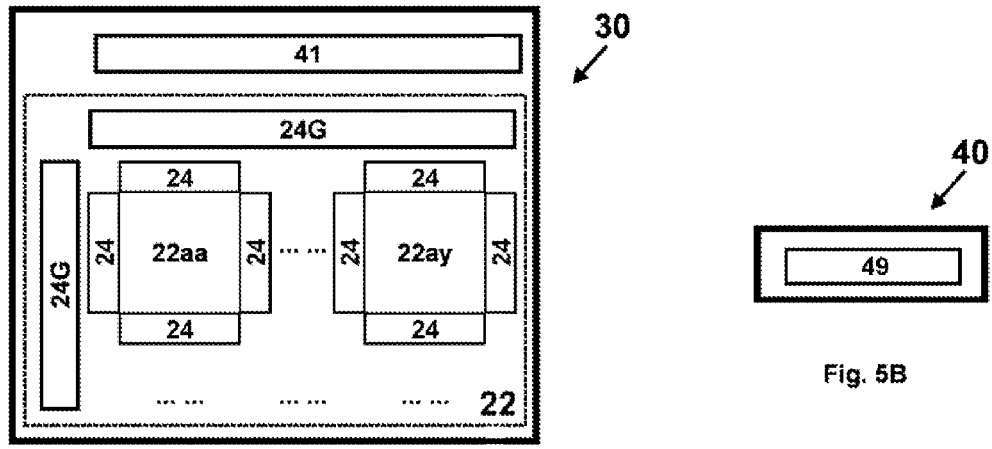
Fig. 5A
Fig. 5B
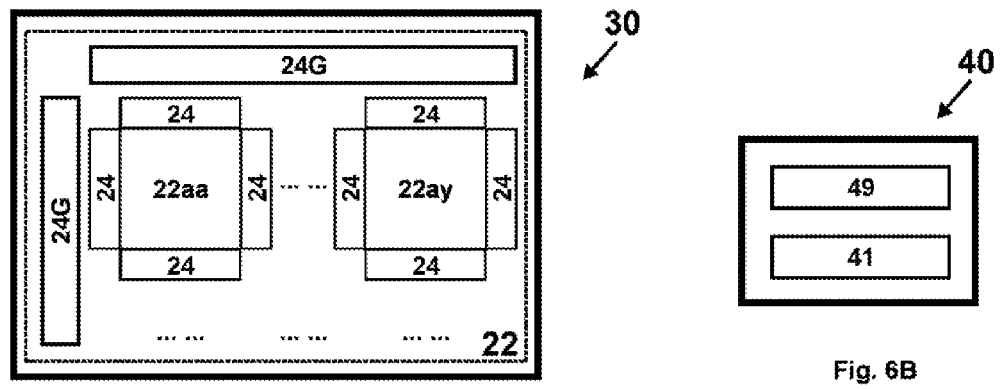
Fig. 6A
Fig. 6B

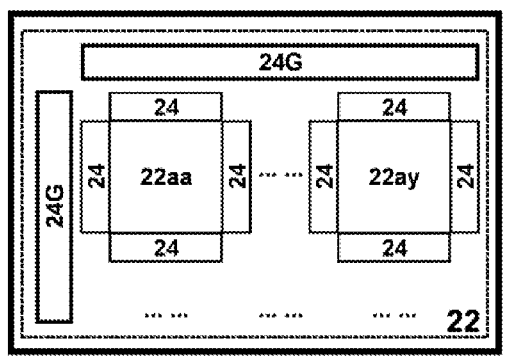
Fig. 7A
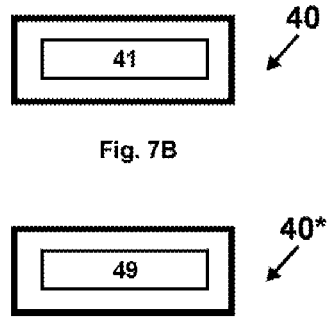
Fig. 7B
Fig. 7C
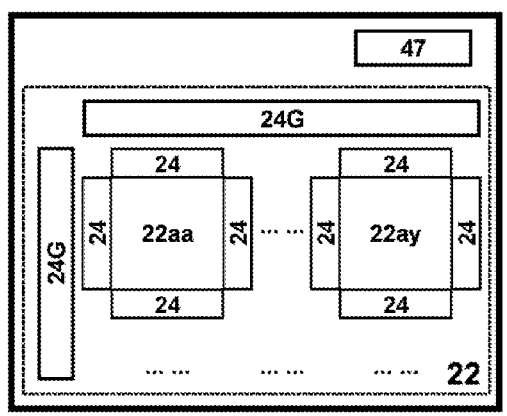
Fig. 8A
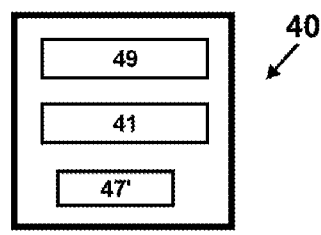
Fig. 8B
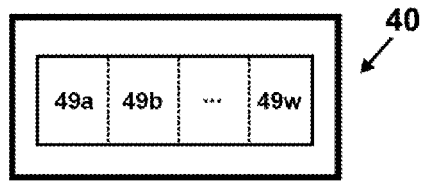
Fig. 9A
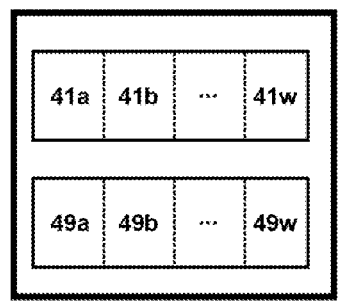
Fig. 9B

THREE-DIMENSIONAL ONE-TIME-PROGRAMMABLE MEMORY COMPRISING OFF-DIE READ/WRITE-VOLTAGE GENERATOR

CROSS-REFERENCE TO RELATED APPLICATIONS

This is a continuation-in-part of application "Discrete Three-Dimensional Memory", application Ser. No. 14/884,755, filed Oct. 15, 2015, which is a continuation-in-part of application "Discrete Three-Dimensional Vertical Memory", application Ser. No. 14/803,104, filed Jul. 19, 2015, which is a continuation-in-part of application "Discrete Three-Dimensional Vertical Memory", application Ser. No. 14/636,359, filed Mar. 3, 2015, which is a continuation-in-part of application "Discrete Three-Dimensional Memory Comprising Dice with Different BEOL Structures", application Ser. No. 14/047,011, filed Oct. 6, 2013, which is a continuation-in-part of application "Discrete Three-Dimensional Memory Comprising Off-Die Read/Write-Voltage Generator", application Ser. No. 13/787,787, filed Mar. 6, 2013, which is a continuation-in-part of application "Discrete Three-Dimensional Memory", application Ser. No. 13/591,257, filed Aug. 22, 2012, which claims benefit of a provisional application "Three-Dimensional Memory with Separate Memory-Array and Peripheral-Circuit Substrates", Application Ser. No. 61/529,929, filed Sep. 1, 2011. This application also claims foreign priority of a Chinese Application Serial No. 201610083717.6, "Three-Dimensional One-Time-Programmable Memory Comprising Off-Die Read/Write-Voltage Generator", Filed Feb. 8, 2016, People's Republic of China (CN).

BACKGROUND

1. Technical Field of the Invention

The present invention relates to the field of integrated circuit, and more particularly to three-dimensional one-time-programmable memory (3D-OTP).

2. Prior Arts

Three-dimensional memory (3D-M) is a monolithic semiconductor memory comprising a plurality of vertically stacked memory cells. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). Depending on the number of times it can be electrically programmed, 3D-EPROM can be further categorized into three-dimensional one-time-programmable memory (3D-OTP) and three-dimensional multiple-time-programmable memory (3D-MTP). 3D-M may be a 3D-memristor, 3D-RRAM or 3D-ReRAM (resistive random-access memory), 3D-PCM (phase-change memory), 3D-PMC (programmable metallization-cell memory), or 3D-CBRAM (conductive-bridging random-access memory).

U.S. Pat. No. 5,835,396 issued to Zhang on Nov. 3, 1998 discloses a 3D-ROM, more particularly a 3D-OTP. As illustrated in FIG. 1A, a 3D-OTP die 20 comprises a substrate circuit 0K and a plurality of vertically stacked memory levels 16A, 16B. The substrate circuit 0K comprises transistors 0t and interconnects 0i. In this example, the interconnects 0i include metal levels 0M1, 0M2. Hereinafter, the metal levels 0M1, 0M2 in the interconnects 0i are referred to as interconnect levels; the materials used in the interconnects 0i are referred to as interconnect materials.

The memory levels 16A, 16B are stacked above the substrate circuit 0K. They are coupled to the substrate 0 through contact vias (e.g. 1av). Each of the memory levels (e.g. 16A) comprises a plurality of upper address lines (e.g. 2a), lower address lines (e.g. 1a) and memory cells (e.g. 1aa). The memory cells could comprise diodes, transistors or other devices. Among all types of memory cells, the diode-based memory cells are of particular interest because they have the smallest size of ~4 $F^2$, where F is the minimum feature size. Since they are generally located at the cross points between the upper and lower address lines, the diode-based memory cells form a cross-point array. Hereinafter, diode is broadly interpreted as any two-terminal device whose resistance at the read voltage is substantially lower than when the applied voltage has a magnitude smaller than or polarity opposite to that of the read voltage. In other disclosures, diode is also referred to as steering device or selection device. In one exemplary embodiment, diode is a semiconductor diode, e.g. p-i-n silicon diode. In another exemplary embodiment, diode is a metal-oxide diode, e.g. titanium-oxide diode, nickel-oxide diode.

The memory levels 16A, 16B collectively form at least a 3D-OTP array 16, while the substrate circuit 0K comprises the peripheral circuit for the 3D-OTP array 16. A first portion of the peripheral circuit is located underneath the 3D-OTP array 16 and it is referred to as under-array peripheral circuit. A second portion of the peripheral circuit is located outside the 3D-OTP array 16 and it is referred to as outside-array peripheral circuits 18. Because the outside-array peripheral circuit 18 generally comprises fewer back-end-of-line (BEOL) levels than the 3D-OTP array 16, the space 17 above the outside-array peripheral circuits 18 is empty and completely wasted. Hereinafter, a BEOL level refers to a level of conductive lines above the substrate, e.g. an address-line level in the memory levels 16A, 16B; or, an interconnect level in the interconnects 0i. In FIG. 1A, the 3D-OTP array 16 comprises a total of six BEOL levels, including the two interconnect levels 0M1, 0M2, two address-line levels 1a, 2a for the first memory level 16A, and two address-line levels 3a, 4a for the second memory level 16B. The outside-array peripheral circuit 18 comprises only two BEOL levels, i.e. the interconnect levels 0M1, 0M2.

U.S. Pat. No. 7,383,476 issued to Crowley et al. on Jun. 3, 2008 discloses an integrated 3D-OTP die, whose 3D-OTP arrays and peripheral circuit are integrated into a single die. Generally, this design methodology is known as full integration. As is illustrated in FIG. 1B, an integrated 3D-OTP die 20 comprises a 3D-array region 22 and a peripheral-circuit region 28. The 3D-array region 22 comprises a plurality of 3D-OTP arrays (e.g. 22aa, 22ay) and their decoders (e.g. 24, 24G). These decoders include local decoders 24 and global decoders 24G. The local decoder 24 decodes address/data for a single 3D-OTP array, while the global decoder 24G decodes global address/data 25 to each 3D-OTP array.

The peripheral-circuit region 28 comprises all necessary peripheral-circuit components for a standalone integrated 3D-OTP die 20 to perform basic memory functions, i.e. it can directly use the voltage supply 23 provided by a user (e.g. a host device or a controller), directly read and/or write data 27 for the user. It includes a read/write-voltage generator ($V_R/V_W$-generator) 21 and an address/data (A/D)-translator 29. The $V_R/V_W$-generator 21 provides read voltage $V_R$ and/or write (programming) voltage $V_W$ to the 3D-OTP array(s). The A/D-translator 29 converts address and/or data from a logical space to a physical space and/or vice versa.

Hereinafter, the logical space is the space viewed from the perspective of a user of the 3D-OTP, while the physical space is the space viewed from the perspective of the 3D-OTP.

It is a prevailing belief in the field of integrated circuit that more integration is better, because integration lowers cost, improves performance and reduces size. However, this belief is no longer true for 3D-OTP. As the 3D-OTP 20 is optimized for the 3D-OTP array 16, the cost, performance and size of the peripheral circuit 18 are sacrificed. First of all, because the 3D-OTP array 16 comprises significantly more BEOL levels than the peripheral circuit 18, full integration would force a relatively simple peripheral circuit 18 to use the expensive BEOL manufacturing process of the 3D-OTP array 16. This increases the overall 3D-OTP cost. Secondly, because it comprises only a small number of interconnect levels (two in FIG. 2), the peripheral circuit 18 is difficult to design, have a poor performance and occupy a large area. Thirdly, full integration would force the peripheral circuit 18 to use the same high-temperature interconnect materials (e.g. tungsten and/or silicon oxide) as the 3D-OTP array 16. These materials slow down the peripheral circuit 18 and in turn, degrade the overall 3D-OTP performance.

OBJECTS AND ADVANTAGES

It is a principle object of the present invention to provide a three-dimensional one-time-programmable memory (3D-OTP) with a lower overall cost.

It is a further object of the present invention to provide a 3D-OTP with an improved overall performance.

It is a further object of the present invention to provide a 3D-OTP with a smaller overall size.

In accordance with these and other objects of the present invention, a discrete 3D-OTP is disclosed.

SUMMARY OF THE INVENTION

To lower its overall cost, improve its overall performance and reduce its overall size, the present invention follows this design guideline for the 3D-OTP: separate the 3-D circuit and 2-D circuit into different dice in such a way that they could be optimized separately. For example, the 3D-OTP array (3-D circuit) and at least a peripheral-circuit component thereof (2-D circuit) are separated into different dice. Accordingly, the present invention discloses a discrete 3D-OTP. It comprises at least a 3D-array die and at least a peripheral-circuit die. The 3D-array die is formed in a 3-D space and comprises a plurality of functional levels. It comprises at least a 3D-OTP array and at least a first peripheral-circuit component thereof, which is referred to as the in-die peripheral-circuit component. The peripheral-circuit die is formed on a 2-D plane and comprises just a single functional level. It comprises at least a second peripheral-circuit component of the 3D-OTP array, which is referred to as the off-die peripheral-circuit component. This off-die peripheral-circuit component is an essential circuit for the 3D-OTP to perform basic memory functions, e.g. directly using the voltage supply provided by a user, directly reading data from the user and/or directly writing data to the user. It could be a read/write-voltage generator ($V_R/V_W$-generator), an address/data translator (A/D-translator), a portion of the $V_R/V_W$-generator, and/or a portion of the A/D-translator. Without this off-die peripheral-circuit component, the 3D-array die per se is not a functional memory.

Designed and manufactured separately, the 3D-array die and the peripheral-circuit die in a discrete 3D-OTP comprise substantially different back-end-of-line (BEOL) structures. Since the 3D-array die and the integrated 3D-OTP die have similar structures, the peripheral-circuit die (of the discrete 3D-OTP) and the integrated 3D-OTP die have substantially different BEOL structures, too. The BEOL structures of the peripheral-circuit die could be independently optimized in such a way that the off-die peripheral-circuit components have lower cost, better performance and/or smaller size than their counterparts in the integrated 3D-OTP. Hence, the discrete 3D-OTP has a lower overall cost, a better overall performance and/or a smaller overall size of than the integrated 3D-OTP of the same storage capacity.

In terms of different BEOL structures, the peripheral-circuit die could differ from the 3D-array die in at least three scenarios. In a first scenario, the peripheral-circuit die comprises substantially fewer BEOL levels than the 3D-array die (or, the integrated 3D-OTP die). Because the wafer cost is roughly proportional to the number of BEOL levels, the peripheral-circuit die would have a much lower wafer cost than the 3D-array die and the integrated 3D-OTP die. Hence, the total die cost of the discrete 3D-OTP (including at least two dice: a 3D-array die and a peripheral-circuit die) is lower than that of the integrated 3D-OTP (which is a single die comprising both the 3D-OTP arrays and the peripheral circuit). In one preferred embodiment, the number of BEOL levels in the 3D-array die is preferably at least twice as much as the number of interconnect levels in the peripheral-circuit die. In another preferred embodiment, the number of address-line levels in the 3D-array die is substantially larger than the number of interconnect levels in the peripheral-circuit die. These large differences ensure that the reduction in the total die cost (from the integrated 3D-OTP to the discrete 3D-OTP) could offset the extra bonding cost (for two separate dice in the discrete 3D-OTP). As a result, the discrete 3D-OTP has a lower overall cost than the integrated 3D-OTP for a given storage capacity.

In a second scenario, the peripheral-circuit die comprises more interconnect levels than the 3D-array die (or, the integrated 3D-OTP die). Accordingly, the off-die peripheral-circuit components of the discrete 3D-OTP are easier to design, have better performance and occupy less die area than their counterparts in the integrated 3D-OTP. Hence, the discrete 3D-OTP has a better overall performance and a smaller overall size than the integrated 3D-OTP. Similar to the integrated 3D-OTP, the interconnects of the 3D-array die do not include any memory structures. The number of interconnect levels in the 3D-array die is the larger of its under-array peripheral-circuit components and its outside-array peripheral-circuit components. It should be reminded that, although a large number is desired, the number of the interconnect levels in the peripheral-circuit die is still bounded by the overall cost of the discrete 3D-OTP. To ensure that the discrete 3D-OTP has a lower overall cost than the integrated 3D-OTP, the peripheral-circuit die should comprise substantially fewer BEOL levels than the 3D-array die (referring to the first scenario). For example, the number of interconnect levels in the peripheral-circuit die is substantially less than the number of address-line levels in the 3D-array die.

In a third scenario, the peripheral-circuit die comprises different interconnect materials than the 3D-array die (or, the integrated 3D-OTP die). To be more specific, the peripheral-circuit die comprise high-speed interconnect materials (e.g. copper and/or high-k dielectric), whereas the 3D-array die and the integrated 3D-OTP die comprise high-temperature interconnect materials (e.g. tungsten and/or silicon oxide). Because the high-speed interconnect materials are generally faster than the high-temperature interconnect materials, the off-die peripheral-circuit components of the discrete 3D-OTP have a faster speed than their counterparts in the integrated 3D-OTP. Hence, the discrete 3D-OTP has a better overall performance than the integrated 3D-OTP.

Accordingly, the present invention discloses a discrete 3D-OTP, comprising: a 3D-array die comprising at least a 3D-OTP array, wherein said 3D-OTP array comprises a plurality of vertically stacked 3D-OTP cells; a peripheral-circuit die comprising at least an off-die peripheral-circuit component of said 3D-OTP array, wherein said off-die peripheral-circuit component is absent from said 3D-array die; means for coupling said 3D-array die and said peripheral-circuit die; wherein the number of BEOL levels in said 3D-array die is at least twice as much as the number of interconnect levels in said peripheral-circuit die; and, said 3D-array die and said peripheral-circuit die are separate dice.

The present invention further discloses another discrete 3D-OTP, comprising: a 3D-array die comprising at least a 3D-OTP array, wherein said 3D-OTP array comprises a plurality of vertically stacked 3D-OTP cells; a peripheral-circuit die comprising at least an off-die peripheral-circuit component of said 3D-OTP array, wherein said off-die peripheral-circuit component is absent from said 3D-array die; means for coupling said 3D-array die and said peripheral-circuit die; wherein the number of interconnect levels in said peripheral-circuit die is more than the number of interconnect levels in said 3D-array die, but substantially less than the number of BEOL levels in said 3D-array die; and, said 3D-array die and said peripheral-circuit die are separate dice.

The present invention further discloses yet another discrete 3D-OTP, comprising: a 3D-array die comprising at least a 3D-OTP array and an in-die peripheral-circuit component of said 3D-OTP array, wherein said 3D-OTP array comprises a plurality of vertically stacked 3D-OTP cells; a peripheral-circuit die comprising at least an off-die peripheral-circuit component of said 3D-OTP array, wherein said off-die peripheral-circuit component is absent from said 3D-array die; means for coupling said 3D-array die and said peripheral-circuit die; wherein said off-die peripheral-circuit component and said in-die peripheral-circuit component comprise different interconnect materials; and, said 3D-array die and said peripheral-circuit die are separate dice.

BRIEF DESCRIPTION OF THE DRAWINGS

FIGS. 5A-5B disclose a first preferred partitioning scheme.

FIGS. 6A-6B disclose a second preferred partitioning scheme.

FIGS. 7A-7C disclose a third preferred partitioning scheme.

FIGS. 8A-8B disclose a fourth preferred partitioning scheme.

FIGS. 9A-9B are block diagrams of two preferred peripheral-circuit dice supporting multiple 3D-array dice.

Figure 1A:
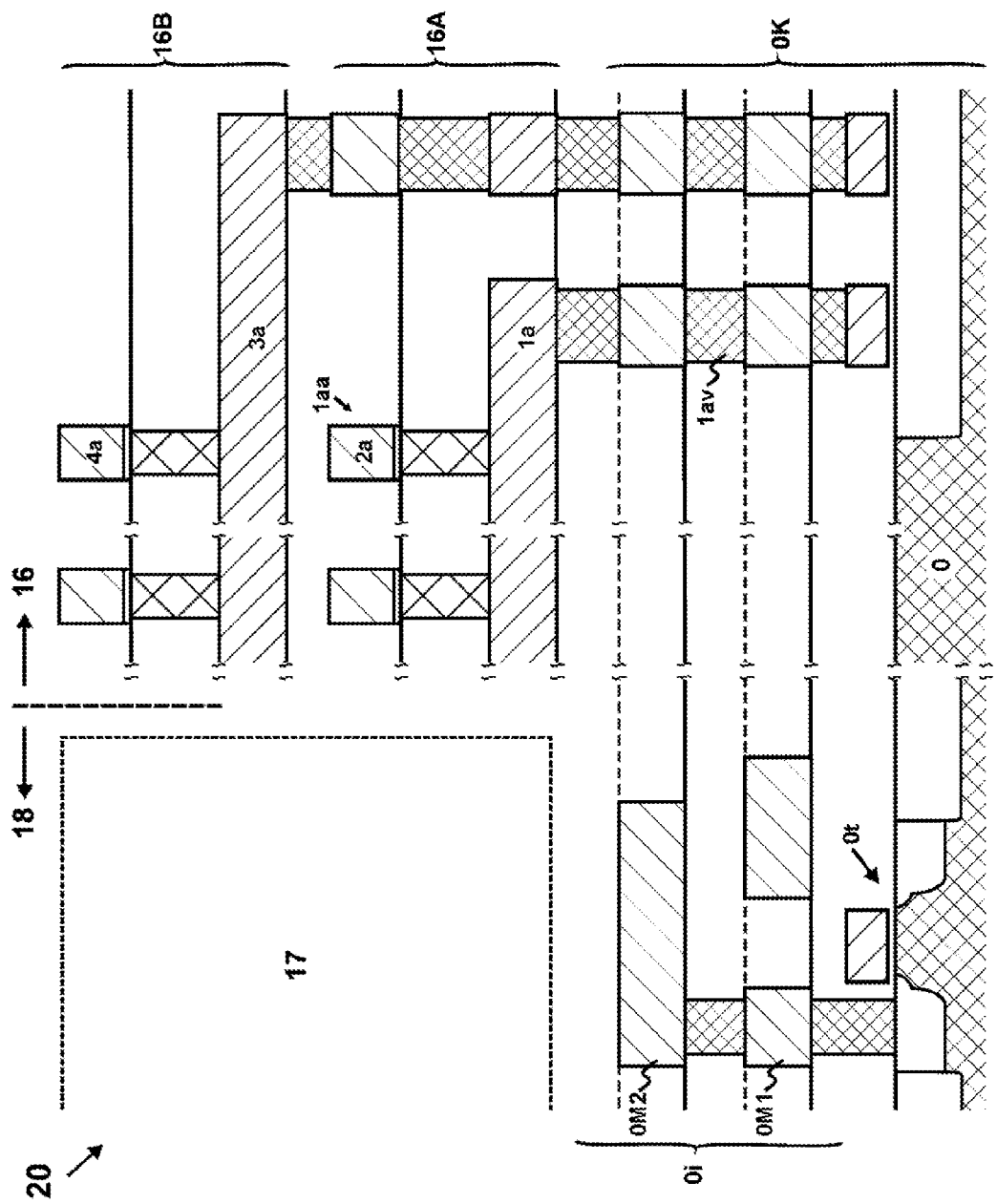
FIG. 1A is a cross-sectional views of an integrated three-dimensional one-time-programmable memory (3D-OTP) (prior art)
Figure 1B:
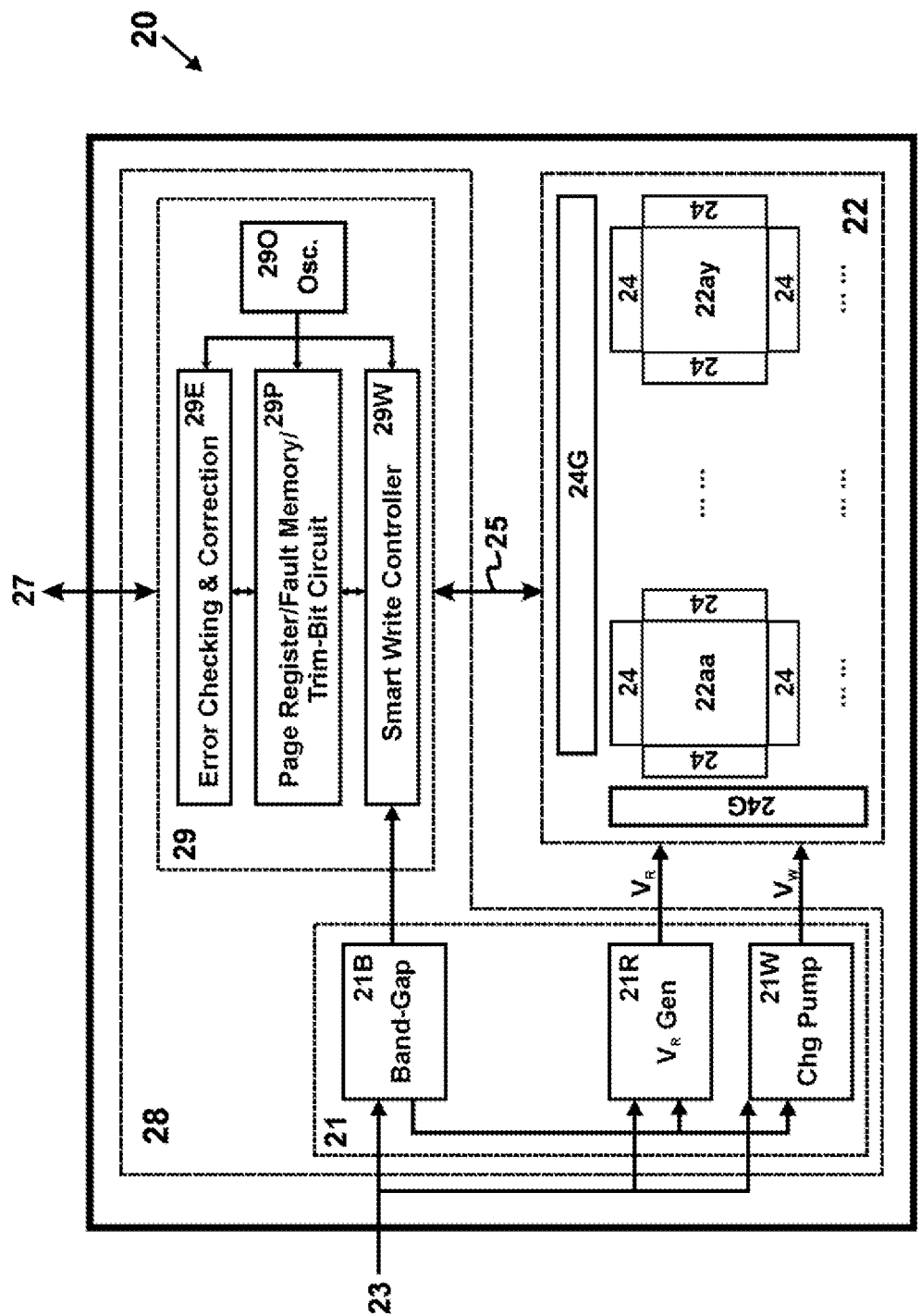
FIG. 1B is a block diagram of an integrated 3D-OTP die (prior art)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

In the present invention, the symbol "/" means a relationship of "and" or "or". For example, the read/write-voltage generator ($V_R/V_W$-generator) could generate either only the read voltage, or only the write voltage, or both the read voltage and the write voltage. In another example, the address/data (A/D)-translator could translate either only address, or only data, or both address and data.

Figure 1C:
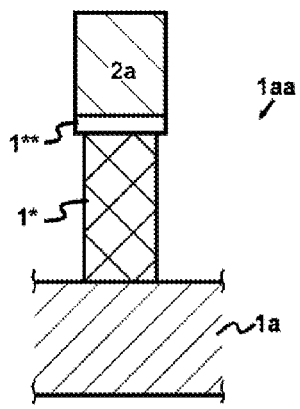
FIG. 1C is a cross-sectional view of an unprogrammed 3D-OTP cell.
Figure 1D:
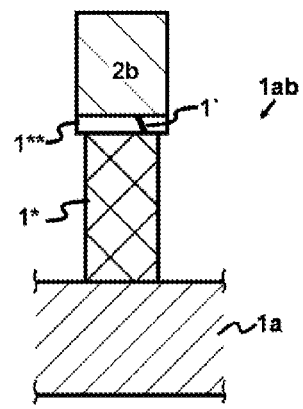
FIG. 1D is a cross-sectional view of a programmed 3D-OTP cell.

Referring now to FIGS. 1C-1D, two 3D-OTP cells 1aa, 1ab are disclosed. The first 3D-OTP cell 1aa of FIG. 1C is an unprogrammed cell. It comprises a bottom electrode 1a (i.e. the $1^{st}$ address-line level), a diode layer 1*, an antifuse layer 1** and a top electrode 2a (i.e. the $2^{nd}$ address-line level). The diode layer 1* functions like a diode (also referred to as steering device or selection device). The antifuse layer 1 has a large resistance before programming. In one preferred embodiment, the antifuse layer 1 comprises a thin layer of silicon oxide. The second 3D-OTP cell 1ab of FIG. 1D is a programmed cell. After subject to a large programming voltage and programming current, the antifuse layer 1** is ruptured and a conductive link 1' is formed therein. As a result, the programmed 3D-OTP cell 1ab has a low resistance.

Referring now to FIGS. 2A-2D, four preferred discrete 3D-OTP 50 are disclosed. The discrete 3D-OTP 50 includes a physical interface 54 according to a standard for connecting to a variety of hosts. Physical interface 54 includes individual contacts 52a, 52b, 54a-54d that connect with corresponding contacts in a host receptacle. The power-supply contact 52a is provided to connect to a power-supply contact in the host receptacle. The voltage supplied by the host to power-supply contact 52a is referred to as voltage supply $V_{DD}$. The ground contact 52b provides a ground connection at a voltage $V_{SS}$. The contacts 54a-54d provide signal connections between the host and the discrete 3D-OTP 50. The signals represented on the contacts 54a-54d include address and data, among others. Because they are directly to/from the host, the address and data represented on the contacts 54a-54d are logical address and logical data.

The discrete 3D-OTP 50 comprises at least a 3D-array die 30 and at least a peripheral-circuit die 40/40*. In these figures, at least an off-die peripheral-circuit component of the 3D-OTP is located on the peripheral-circuit die 40/40* instead of the 3D-array die 30. This off-die peripheral circuit is an essential circuit for the 3D-OTP to perform basic memory functions, e.g. directly using the voltage supply provided by a user, directly reading data from the user and/or directly writing data to the user. It could be a read/write-voltage generator ($V_R/V_W$-generator), an address/data translator (A/D-translator), a portion of the $V_R/V_W$-generator, and/or a portion of the A/D-translator. Without this off-die peripheral circuit, the 3D-array die 30 per se is not a functional memory.

Figure 2A:
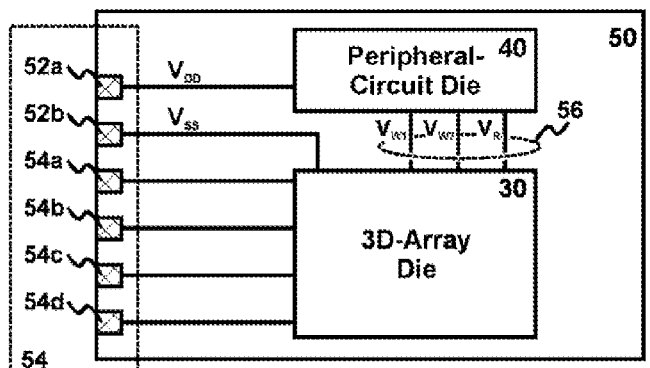
FIGS. 2A-2D illustrate four preferred discrete 3D-OTP's.

The preferred discrete 3D-OTP 50 in FIG. 2A is in the form of a memory card. Its peripheral-circuit die 40 comprises an off-die $V_R/V_W$-generator, which receives a voltage supply $V_{DD}$ from the power-supply contact 52a and provides the 3D-array die 30 with at least a read/write voltage through a power bus 56. The read/write voltage includes at least a read voltage and/or a write voltage other than the voltage supply $V_{DD}$. In other words, it could be either at least a read voltage $V_R$, or at least a write voltage $V_W$, or both read voltage $V_R$ and write voltage $V_W$, and the values of these read voltages and write voltages are different from the voltage supply $V_{DD}$. In this preferred embodiment, the read/write voltage includes one read voltage $V_R$ and two write voltages $V_{W1}$, $V_{W2}$. Alternatively, it could include more than one read voltage or more than two write voltages.

Figure 2B:
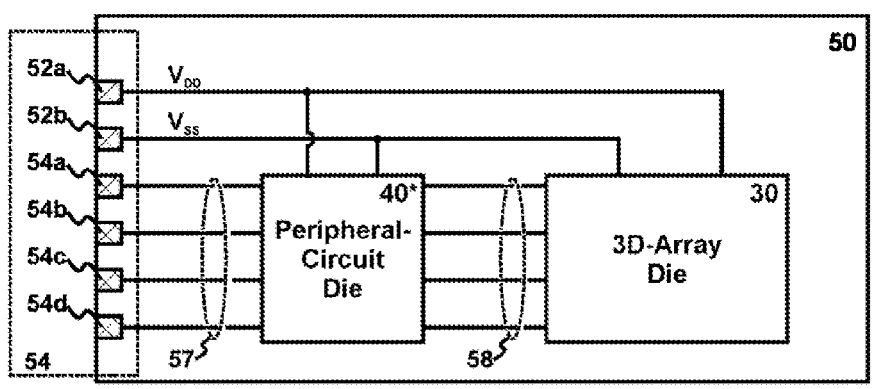

The preferred discrete 3D-OTP 50 in FIG. 2B is also in the form of a memory card. Its peripheral-circuit die 40* comprises an off-die A/D-translator, which includes an address converter and/or a data converter. The address converter converts the logical address 57 represented on the contacts 54a-54d to the physical address represented on an internal bus 58 and/or vice versa; the data converter converts the logical data 57 represented on the contacts 54a-54d to the physical data represented on an internal bus 58 and/or vice versa. The A/D-translator could convert address only, data only, or both address and data.

Figure 2C:
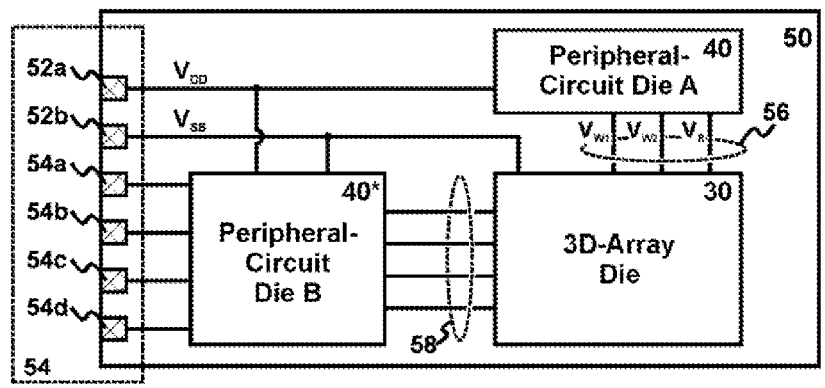

The preferred discrete 3D-OTP 50 in FIG. 2C is also in the form of a memory card. It comprises two peripheral-circuit dice: a peripheral-circuit die A 40 and a peripheral-circuit die B 40*. The peripheral-circuit die A 40 comprises an off-die $V_R/V_W$-generator and the peripheral-circuit die B 40* comprises an off-die A/D-translator.

Figure 2D:
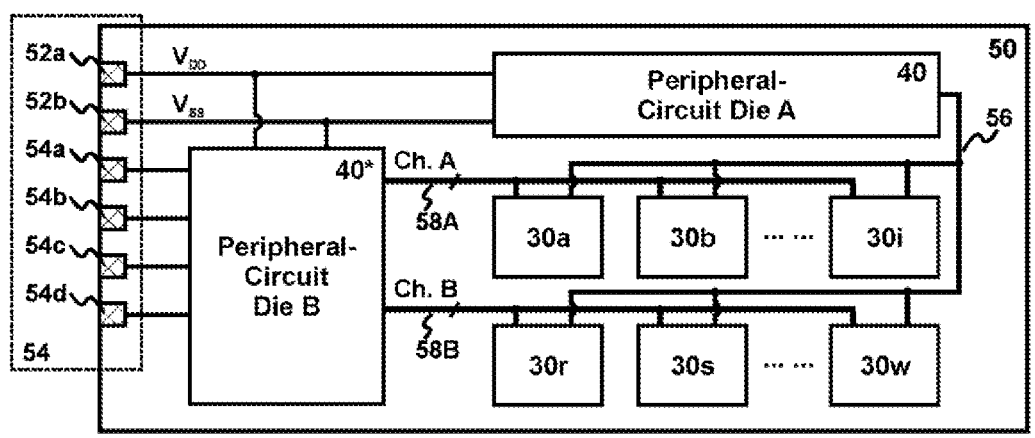

The preferred discrete 3D-OTP 50 in FIG. 2D can be used for a high-capacity memory card or a solid-state drive. It comprises two peripheral-circuit dice 40, 40* and a plurality of 3D-array dice 30a, 30b . . . 30w. The peripheral-circuit die A 40 comprises an off-die $V_R/V_W$-generator and the peripheral-circuit die B 40* comprises an off-die A/D-translator. The 3D-array dice form two channels: Channel A and Channel B. The internal bus 58A on Channel A provides physical address/data to the 3D-array dice 30a, 30b . . . 30i, while the internal bus 58B on Channel B provides physical address/data to the 3D-array dice 30r, 30s . . . 30w. The power bus 56 provides the read/write-voltages to all 3D-array dice 30a, 30b . . . 30w. Although two channels are used in this example, it should be apparent to those skilled in the art that more than two channels may be used.

Figure 3A:
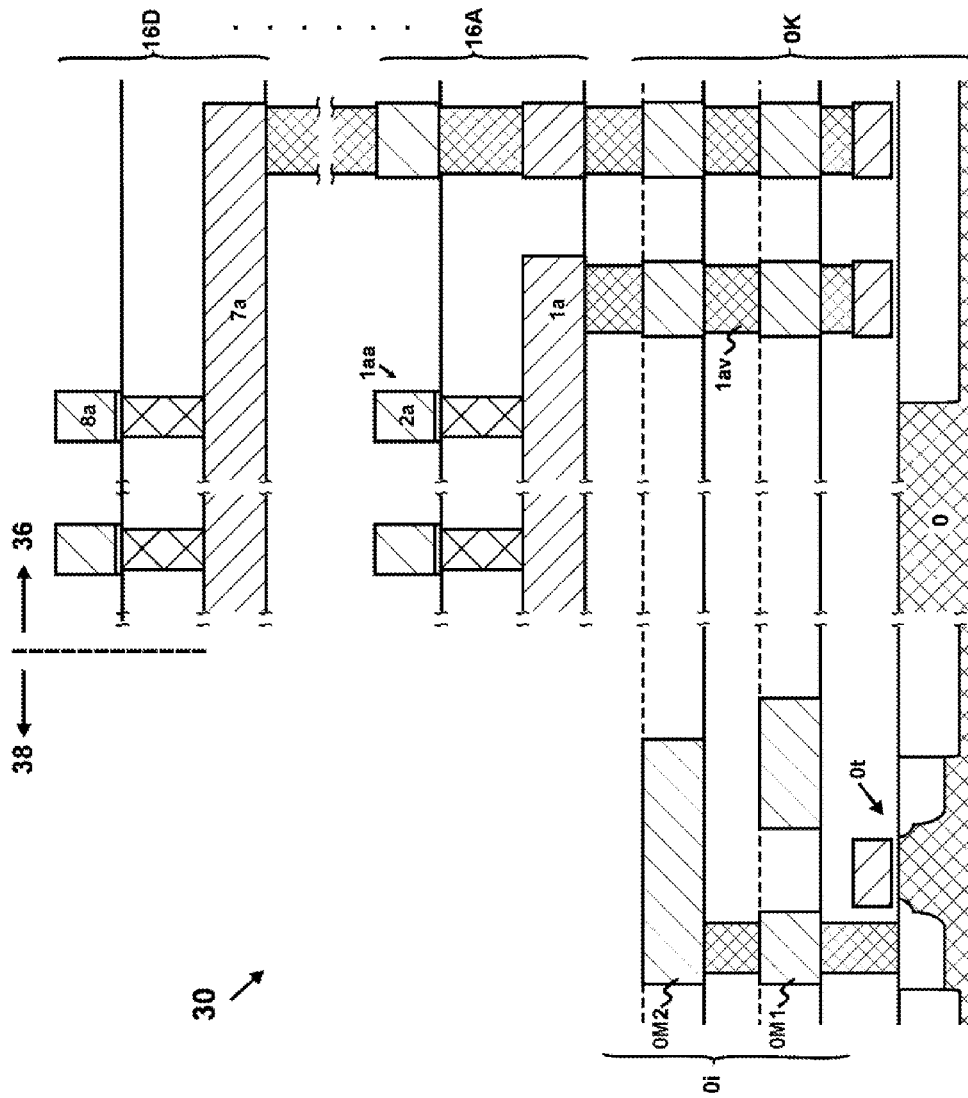
FIGS. 3A-3B are cross-sectional views of two preferred 3D-array dice;.

Referring now to FIG. 3A, a cross-sectional view of a preferred 3D-array die 30 is disclosed. It comprises at least a 3D-OTP array 36 and an in-die peripheral-circuit component 38. The 3D-OTP array 36 is formed in a 3-D space and comprises a plurality of vertically stacked memory levels 16A-16D. Each memory level (e.g. 16A) comprises a plurality of 3D-OTP cells (e.g. 1aa), which is located at the intersection of two address lines 1a and 2a. Hereinafter, the address lines at the same level as a specific address line form an address-line level. Note that the 3D-OTP array of FIG. 3A is a separated 3D-OTP, where adjacent memory levels are separated by a layer of insulating dielectric. Accordingly, the number of address-line levels is twice as much as the number of memory levels. In this example, the number of address-line levels in the 3D-array die 30 is eight, i.e. 8a-8a (address lines 3a-6a are not shown), while the number of memory levels in the 3D-array die 30 is four, i.e. 16A-16D (memory levels 16B and 16C are not shown).

The in-die peripheral circuit 38 comprises transistors 0t and interconnects 0i. As the interconnects of the 3D-array die 30 include the BEOL structures above the substrate 0 except all memory structures, the interconnects 0i in the in-die peripheral circuit 38 of FIG. 3A are also the interconnects of the 3D-array die 30. On the other hand, because the in-die peripheral circuit 38 could comprise under-array peripheral-circuit components and outside-array peripheral-circuit components, the number of interconnect levels in the 3D-array die 30 is the larger of the under-array peripheral-circuit components and the outside-array peripheral-circuit components. In this example, the number of interconnect levels in the 3D-array die 30 is two, i.e. 0M1, 0M2.

Because the 3D-OTP array 36 is formed above the in-die peripheral-circuit component 38, the total number of BEOL levels in the 3D-array die 30 would be equal to the sum of the number of its address-line levels and the number of its interconnect levels. In this case, the total number of BEOL levels in the 3D-array die 30 is ten, including eight address-line levels 1a-8a and two interconnect levels 0M1-0M2.

Figure 3B:
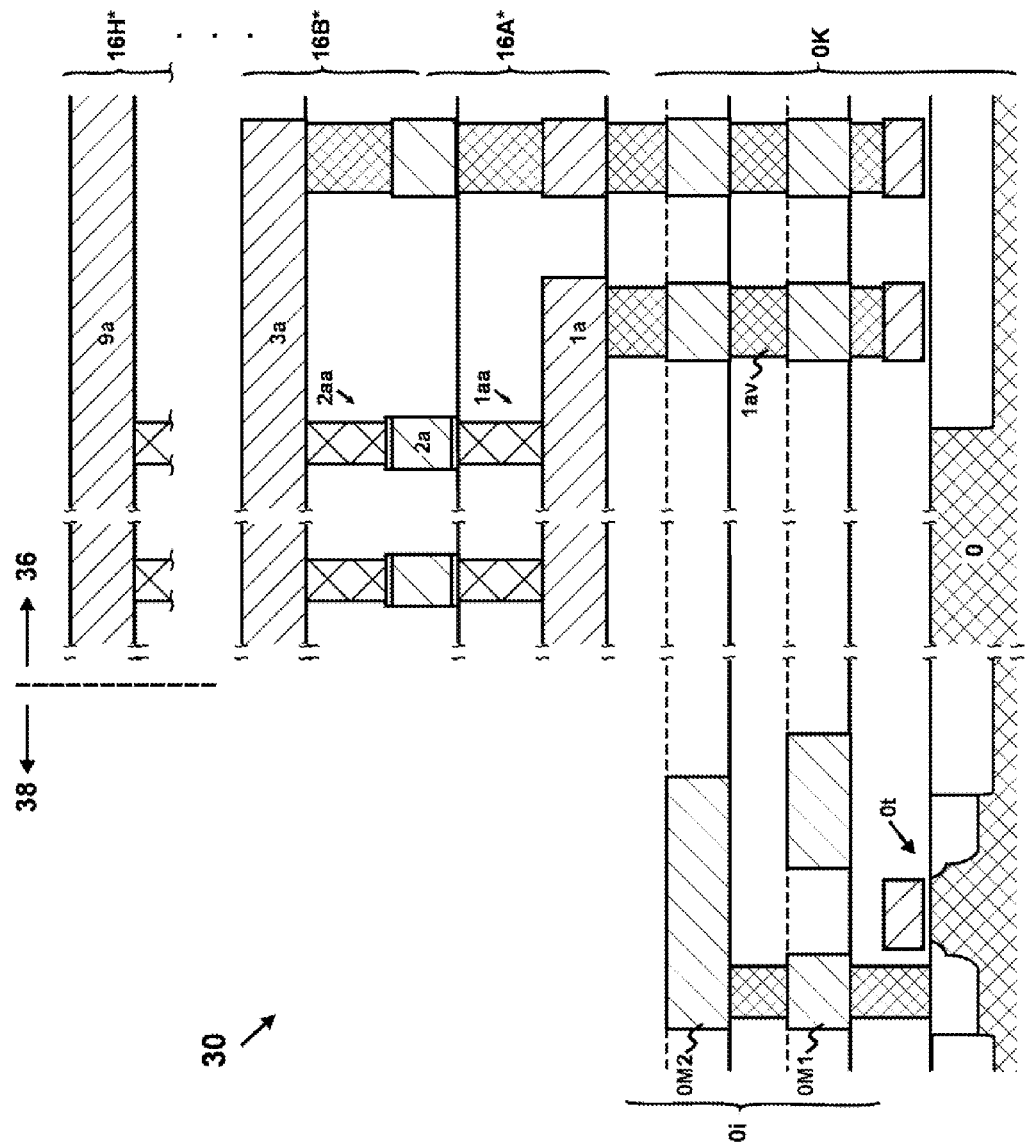

Referring now to FIG. 3B, a cross-sectional view of a second preferred 3D-array die 30 is disclosed. It is an interleaved 3D-OTP, where adjacent memory levels (e.g. 16A* and 16B*) share at least a common address line (e.g. 2a), i.e. the memory cell 1aa is formed at the intersection of two address lines 1a and 2a, while the memory cell 2aa is formed at the intersection of two address lines 2a and 3a. Accordingly, the number of address-line levels would be just one more than the number of memory levels. In this example, the number of address-line levels in the 3D-array die 30 is nine, i.e. 1a-9a (address lines 3a-8a are not shown), while the number of memory levels is eight, i.e. 16A*-16H* (memory levels 16C*-16G * are not shown). Overall, the total number of BEOL levels in this 3D-array die 30 is eleven, including nine address-line levels 1a-9a and two interconnect levels 0M1-0M2.

The interleaved 3D-OTP uses fewer address-line levels to achieve the same memory levels and therefore, has a lower manufacturing cost. Besides being fully interleaved, the interleaved 3D-OTP could be partially interleaved, i.e. some adjacent memory levels are separated while other adjacent memory levels are interleaved. More details on the interleaved 3D-OTP can be found in U.S. Patent Application "Hybrid-Level Three-Dimensional Memory", application Ser. No. 11/736,767, filed Apr. 18, 2007.

Although the cross-sectional views of FIGS. 3A-3B are similar to that of FIG. 1A, the peripheral circuit 18 of FIG. 1A comprises all peripheral-circuit components of the integrated 3D-OTP 20, whereas at least one peripheral-circuit component of the discrete 3D-OTP 30 is absent from the in-die peripheral circuit 38 of FIGS. 3A-3B. For example, at least a $V_R/V_W$-generator and/or an A/D-translator is absent from the in-die peripheral circuit 38. Further details on the in-die peripheral circuit 38 are disclosed in FIGS. 5A-8B.

Figure 4A:
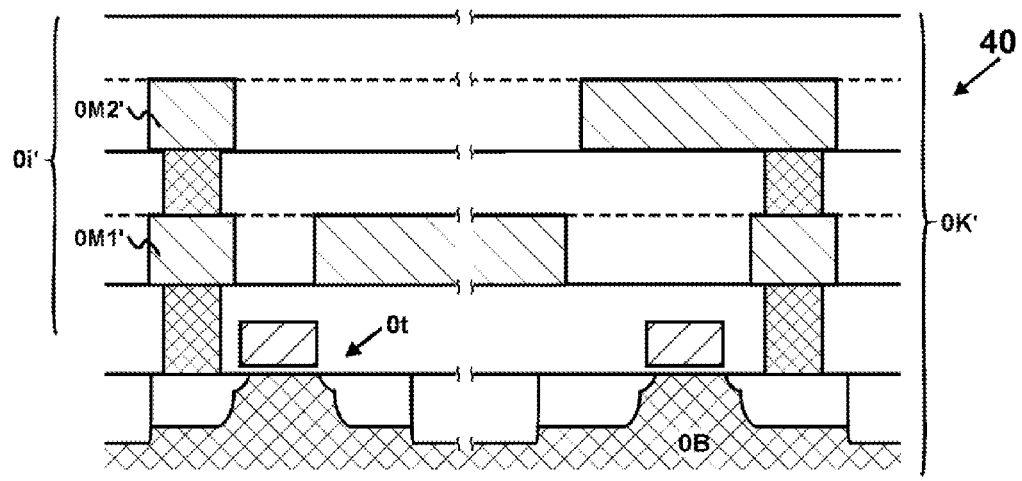
FIGS. 4A-4B are cross-sectional views of two preferred peripheral-circuit dice.
Figure 4B:
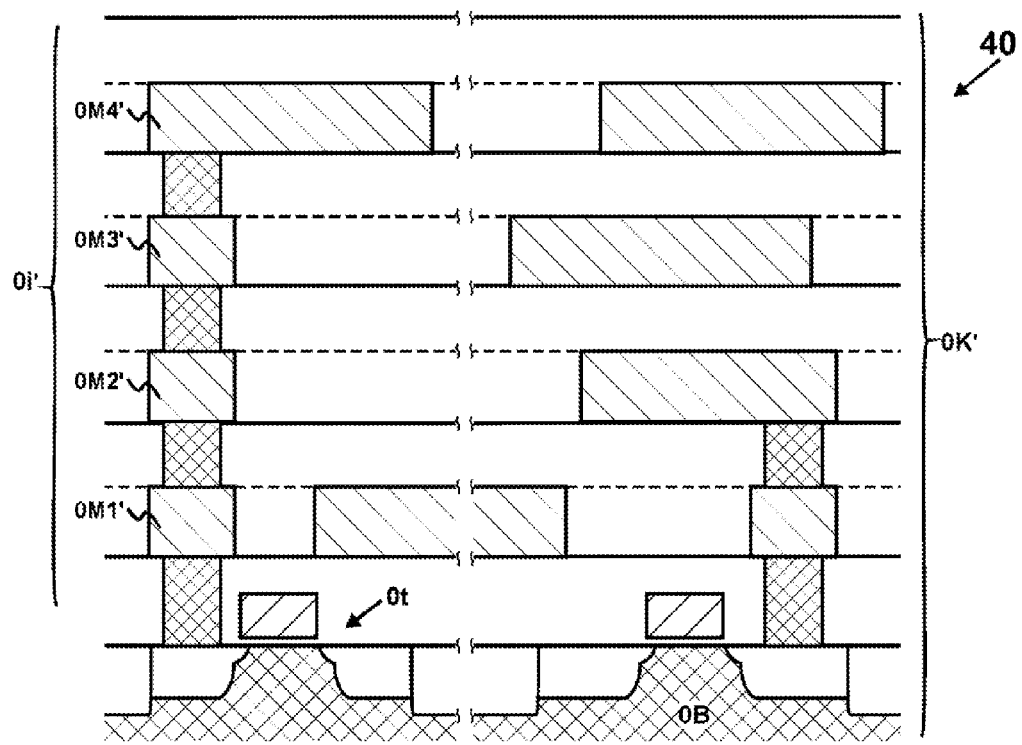

Referring now to FIG. 4A-4B, cross-sectional views of two preferred peripheral-circuit dice 40 are disclosed. The peripheral-circuit die 40 is formed on a 2-D plane and includes a single functional level, i.e. the substrate circuit 0K'. The substrate circuit 0K' comprises transistors 0t' and interconnects 0i'. As the peripheral-circuit die 40 does not comprise any memory structures, its BEOL levels are same as its interconnect levels. In the example of FIG. 4A, the number of BEOL levels (or, interconnect levels) in the peripheral-circuit die 40 is two, i.e. 0M1'-0M2'; in the example of FIG. 4B, the number of BEOL levels (or, interconnect levels) in the peripheral-circuit die 40 is four, i.e. 0M1'-0M4'.

In the preferred embodiments of FIGS. 3A-4B, the number of BEOL levels (10 or 11) in the 3D-array die 30 is substantially more than the number of the BEOL levels (2 or 4) in the peripheral-circuit die 40. A more stringent requirement is that the number of BEOL levels in the 3D-array die 30 is at least twice as much as the number of interconnect levels in the peripheral-circuit die 40. Because the manufacturing cost of an integrated circuit is roughly proportional to the number of its BEOL levels, the peripheral-circuit die 40 has a much lower wafer cost than the 3D-array die 30. This cost reduction is sufficient to offset the extra bonding cost required by the discrete 3D-OTP. Accordingly, the discrete 3D-OTP 50 has a lower overall cost than the integrated 3D-OTP 20.

Furthermore, because the peripheral-circuit die 40 (FIG. 4B) comprises more interconnect levels (4 vs. 2) than the in-die peripheral circuit 18 of the integrated 3D-OTP die 20 (FIG. 1A), the off-die peripheral-circuit components in the peripheral-circuit die 40 are easier to design, have a better performance and occupy less die area than its counterpart in the integrated 3D-OTP die 20. Note that, although it comprises more interconnect levels (4 vs. 2) than the 3D-array die 30, the peripheral-circuit die 40 still comprises significantly fewer BEOL levels (4 vs. 10 or 11) than the 3D-array die 30.

In addition, because its BEOL process does not have to go through any high-temperature BEOL processing steps, the peripheral-circuit die 40 may use high-speed interconnect materials for its interconnects 0i' (e.g. copper and/or low-k dielectric). These high-speed interconnect materials can improve the performance of the peripheral-circuit die 40, as well as the overall 3D-OTP performance.

For a conventional two-dimensional memory (2D-M, whose memory cells are arranged on a 2-D plane, e.g. flash memory), although it is technically possible to form at least a peripheral-circuit component in a peripheral-circuit die instead of a 2D-array die, doing so will raise the overall cost, degrade the overall performance and increase the overall size. This is because the 2D-array die and the peripheral-circuit die have similar BEOL structures, similar wafer costs and similar performance. Adding the extra bonding cost and delay, a discrete 2D-M has a higher cost, a slower speed and a larger size than an integrated 2D-M. This is in sharp contrast to the 3D-OTP. The 3D-array die 30 and peripheral-circuit die 40 of a discrete 3D-OTP 50 have substantially different BEOL structures (e.g. different number of BEOL levels, different number of interconnect levels, different interconnect materials). As a result, a discrete 3D-OTP has a lower overall cost, a better overall performance and a smaller overall size than an integrated 3D-OTP.

Different from the integrated 3D-OTP 20, at least a peripheral-circuit component of the discrete 3D-OTP 50 is located on the peripheral-circuit die 40 instead of the 3D-array die 30. In other words, the peripheral-circuit components of 3D-OTP are partitioned between the 3D-array die 30 and the peripheral-circuit die 40. Several preferred partitioning schemes are disclosed in FIGS. 5A-9B.

FIGS. 5A-5B disclose a first preferred partitioning scheme. The discrete 3D-OTP 50 comprises a 3D-array die 30 and a peripheral-circuit die 40. In FIG. 5A, the 3D-array die 30 comprises a plurality of 3D-OTP arrays (e.g. 22aa, 22ay) and decoders. It also comprises an in-die $V_R/V_W$-generator 41. In FIG. 5B, the peripheral-circuit die 40 comprises at least an off-die A/D-translator 49, which is absent from the 3D-array die 30 of FIG. 5A. Without the A/D-translator 49, the 3D-array die 30 of FIG. 5A is not a functional memory per se but has a higher array efficiency. Alternatively, the 3D-array die 30 comprises an in-die A/D-translator, while the peripheral-circuit die 40 comprises an off-die $V_R/V_W$-generator, which is absent from the 3D-array die 30. Similarly, without the $V_R/V_W$-generator, the 3D-array die 30 of FIG. 5A is not a functional memory per se but has a higher array efficiency.

FIGS. 6A-6B disclose a second preferred partitioning scheme. The discrete 3D-OTP 50 comprises a 3D-array die 30 and a peripheral-circuit die 40. In FIG. 6A, the 3D-array die 30 comprises the 3D-OTP arrays (e.g. 22aa, 22ay) and their decoders, but does not comprise the $V_R/V_W$-generator 41 and the A/D-translator 49. In FIG. 6B, the peripheral-circuit die 40 comprises not only the A/D-translator 49, but also the $V_R/V_W$-generator 41. The 3D-array die 30 of FIG. 6A has a very high array efficiency. This leads to a substantially lower overall cost for the discrete 3D-OTP.

FIGS. 7A-7C disclose a third preferred partitioning scheme. The discrete 3D-OTP 50 comprises a 3D-array die 30, two peripheral-circuit dice 40, 40*. The 3D-array die 30 comprises 3D-OTP arrays (e.g. 22aa, 22ay) and their decoders, but does not comprise the $V_R/V_W$-generator 41 and the A/D-translator 49 (FIG. 7A). The $V_R/V_W$-generator 41 and the A/D-translator 49 are located on separate dice: the $V_R/V_W$-generator 41 is located on the peripheral-circuit die A 40 (FIG. 7B); the A/D-translator 49 is located on the peripheral-circuit die B 40* (FIG. 7C). As is well known to those skilled in the art, the $V_R/V_W$-generator is an analog-intensive circuit, whereas the A/D-translator is a digital-intensive circuit. Because they are located on separate dice, these circuits can be optimized independently: the peripheral-circuit die A 40 is optimized for analog performance, whereas the peripheral-circuit die B 40* is optimized for digital performance.

FIGS. 8A-8B disclose a fourth partitioning scheme. It is similar to those in FIGS. 6A-6B except that the 3D-array die 30 further comprises a first serializer-deserializer (SerDes) 47 (FIG. 8A). It converts parallel digital signals (e.g. address/data/command/status) inside the 3D-array die 30 to serial digital signals outside the 3D-array die 30 and vice versa. In the mean time, the peripheral-circuit die 40 comprise a second serializer-deserializer (SerDes) 47' (FIG. 8B). It converts parallel digital signals (e.g. address/data/command/status) inside the peripheral-circuit die 40 to serial digital signals outside the peripheral-circuit die 40 and vice versa. By serializing digital signals, the number of bond wires (or, solder bumps) can be reduced between the 3D-array die 30 and the peripheral-circuit die 40. This helps to lower the bonding cost.

Referring now to FIGS. 9A-9B, two preferred peripheral-circuit dice 40 supporting multiple 3D-array dice are illustrated. The peripheral-circuit die 40 of FIG. 9A comprises a plurality of A/D-translators 49a, 49b . . . 49w (or, $V_R/V_W$- generators). Each A/D-translator (e.g. 49a) translates address/data for an associated 3D-array die (e.g. 30a of FIG. 3D). The preferred peripheral-circuit die 40 of FIG. 9B further comprises a plurality of $V_R/V_W$-generators 41a, 41b ... 41w. Each $V_R/V_W$-generator (e.g. 41 a) provides read/write-voltages to an associated 3D-array die (e.g. 30a of FIG. 3D).

Figure 10A:
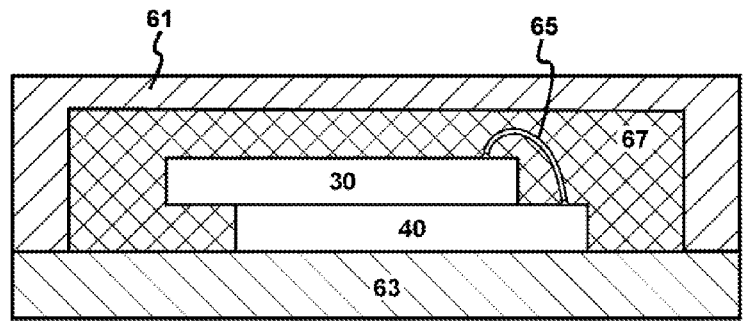
FIGS. 10A-10B are cross-sectional views of two preferred discrete 3D-OTP packages.
Figure 10B:
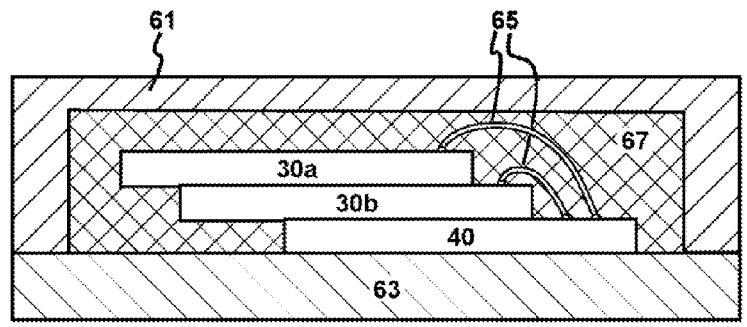
Figure 10C:
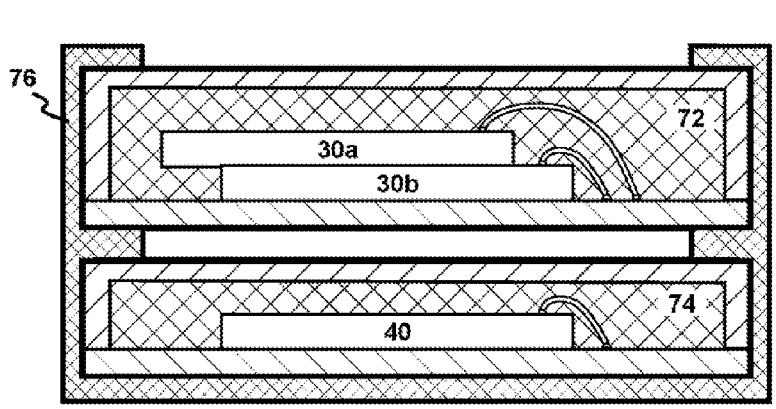
FIG. 10C is a cross-sectional view of a preferred discrete 3D-OTP module.

Referring now to FIG. 10A-10C, several preferred discrete 3D-OTP packages (or, module) 60 are disclosed. The 3D-OTP packages in FIGS. 10A-10B are multi-chip package (MCP), while the 3D-OTP module in FIG. 10C is a multi-chip module (MCM). These MCP's and MCM's can be used as a memory card and/or a solid-state drive.

The preferred discrete 3D-OTP package 60 of FIG. 10A comprises two separate dice: a 3D-array die 30 and a peripheral-circuit die 40. These dice 30, 40 are vertically stacked on a package substrate 63 and located inside a package housing 61. Bond wires 65 provide electrical connection between the dice 30 and 40. Here, bond wire 65 provides a coupling means between the 3D-array die 30 and the peripheral-circuit die 40. Other exemplary coupling means include solder bump. To ensure data security, the dice 30, 40 are preferably encapsulated into a molding compound 67. In this preferred embodiment, the 3D-array die 30 is vertically stacked above the peripheral-circuit die 40. Alternatively, the peripheral-circuit die 40 can be vertically stacked above the 3D-array die 30; or, the 3D-array die 30 can be stacked face-to-face towards the peripheral-circuit die 40; or, the 3D-array die 30 can be mounted side-by-side with the peripheral-circuit die 40.

The preferred discrete 3D-OTP package 60 of FIG. 10B comprises two 3D-array dice 30a, 30b and a peripheral-circuit die 40. These dice 30a, 30b, 40 are three separate dice. They are located inside a package housing 61. The 3D-array die 30a is vertically stacked on the 3D-array die 30b, and the 3D-array die 30b is vertically stacked on the peripheral-circuit die 40. Bond wires 65 provide electrical connections between the dice 30A, 30B, and 40.

The preferred discrete 3D-OTP module 60 of FIG. 10C comprises a module frame 76, which houses two discrete packages, i.e. a 3D-array package 72 and a peripheral-circuit package 74. The 3D-array package 72 comprises two 3D-array dice 30a, 30b, while the peripheral-circuit package 74 comprises a peripheral-circuit die 40. The module frame 76 provides electrical connections between the 3D-array package 72 and the peripheral-circuit package 74 (not drawn in this figure).

Figure 11A:
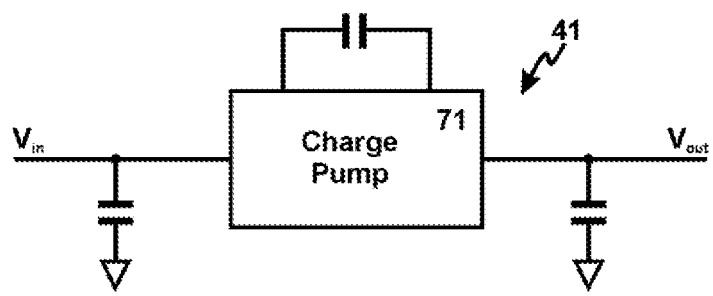
FIGS. 11A-11C are block diagrams of three preferred read/write-voltage generators.
Figure 11B:
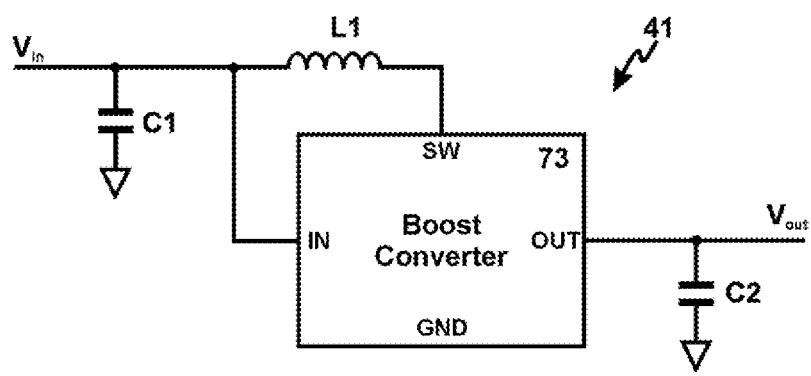
Figure 11C:
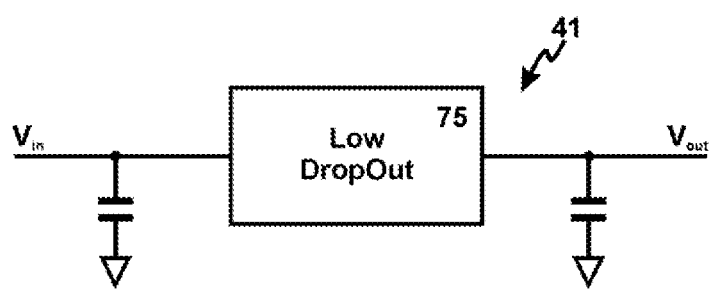

Referring now to FIGS. 11A-11C, three preferred voltage generators 41 are disclosed. The voltage generator 41 preferably uses a DC-to-DC converter. It could be a step-up, whose output voltage is higher than the input voltage, or a step-down, whose output voltage is lower than the input voltage. Examples of step-up include charge pump (FIG. 11A) and boost converter (FIG. 11B), and examples of step-down include low dropout (FIG. 11C) and buck converter.

In FIG. 11A, the voltage generator 41 includes a charge pump 71 to provide an output voltage $V_{out}$ that is higher than the input voltage V. The voltage generator 41 may include one or more integrated circuits and also include one or more discrete devices. Charge pump 71 may generally be formed having a low profile that fits within the physical constraints of low-profile memory cards.

In FIG. 11B, the voltage generator 41 is a high frequency boost converter 73. It may also be used to generate an output voltage $V_{out}$ that is higher than an input voltage V. A boost converter may be formed with a low profile inductor so that the profile of the $V_R/V_W$-generator is within the limits for a memory card or a solid-state drive.

In FIG. 11C, the voltage generator 41 includes a low dropout (LDO) 75 to provide an output voltage $V_{out}$ that is lower than the input voltage V. Generally, an LDO uses one or more (in this case, two) capacitors. Thus, the $V_R/V_W$-generator may be comprised of at least one die and may also include one or more discrete devices.

Figure 12A:
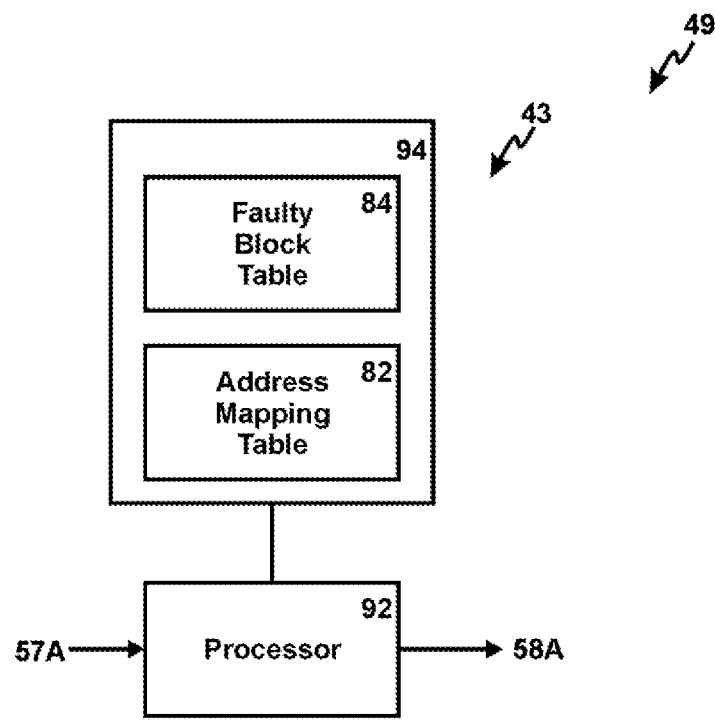
FIG. 12A is a block diagram of a preferred address translator.
Figure 12B:
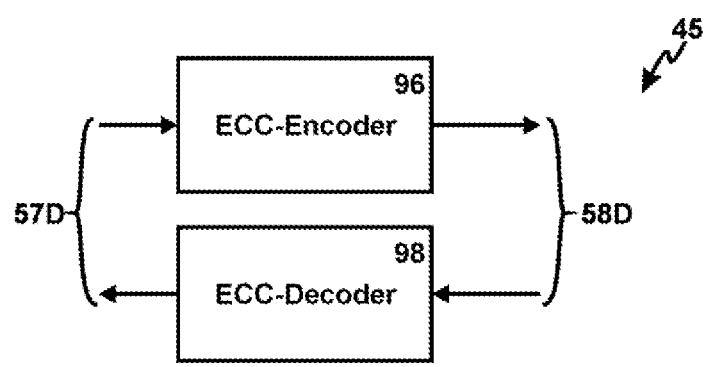
FIG. 12B is a block diagram of a preferred data translator.

Referring now to FIGS. 12A-12B, components of an A/D-translator 49, i.e. address translator 43 and data translator 45, are disclosed. FIG. 12A discloses a preferred address translator 43. It converts the logical address 57A it receives from the host to the physical address 58A of a 3D-array die. The address translator 43 comprises a processor 92 and a memory 94. The memory 94 preferably stores an address mapping table 82, a faulty block table 84 and others. These tables are permanently stored in a read-only memory (ROM), which could a non-volatile memory (NVM) such as flash memory. During operation, these tables are loaded into a random-access memory (RAM) for faster access. When a single A/D-translator die 40* supports multiple 3D-array dice (e.g. 30a, 30b ... 30w, as shown in FIG. 2C), the memory 94 stores tables for all 3D-array dice supported by the A/D-translator die 40*. In other words, the memory 94 is shared by all 3D-array dice 30a, 30b ... 30w.

FIG. 12B discloses a preferred data translator 45. It converts the logical data it receives from the host to the physical data of a 3D-array die, or converts the physical data of a 3D-array die to the logical data it outputs to the host. The data translator 45 comprises an ECC-encoder 96 and an ECC-decoder 98. The ECC-encoder 96 encodes the input logical data 57D to the physical data 58D, which are to be stored in the 3D-OTP array. The ECC-decoder 98 decodes the physical data 58D retrieved from the 3D-OTP array to the output logical data 57D. During this process, the error bits in the physical data 58D are detected and corrected. The ECC coding algorithms that are suitable for the 3D-OTP include Reed-Solomon coding, Golay coding, BCH coding, Multi-dimensional parity coding, Hamming coding and others.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A discrete three-dimensional one-time-programmable memory (3D-OTP), comprising:
  a 3D-array die comprising at least a 3D-OTP array, wherein said 3D-OTP array comprises a plurality of vertically stacked 3D-OTP cells;
  a peripheral-circuit die comprising at least an off-die $V_R/V_W$-generator of said 3D-OTP array, wherein said off-die $V_R/V_W$-generator generates at least a read voltage and/or a write voltage different from a supply voltage;
  means for coupling said 3D-array die and said peripheral-circuit die;
  wherein the number of back-end-of-line (BEOL) levels in said 3D-array die is at least twice as much as the number of interconnect levels in said peripheral-circuit die; said off-die $V_R/V_W$-generator is absent from said 3D-array die; and, said 3D-array die and said peripheral-circuit die are separate dice.

2. The memory according to claim 1, wherein each of said 3D-OTP cells comprises an antifuse layer.

3. The memory according to claim 1, wherein said 3D-array die and said peripheral-circuit die are located in a memory package, a memory module, a memory card, or a solid-state drive.

4. The memory according to claim 1, further comprising another 3D-array die including at least another 3D-OTP array, wherein said peripheral-circuit die comprises at least another portion of another off-die $V_R/V_W$-generator for said another 3D-array die.

5. The memory according to claim 1, wherein said off-die $V_R/V_W$-generator is a read-voltage generator.

6. The memory according to claim 1, wherein said off-die $V_R/V_W$-generator is a write-voltage generator.

7. A discrete three-dimensional one-time-programmable memory (3D-OTP), comprising:
- a 3D-array die comprising at least a 3D-OTP array, wherein said 3D-OTP array comprises a plurality of vertically stacked 3D-OTP cells;
- a peripheral-circuit die comprising at least an off-die $V_R/V_W$-generator of said 3D-OTP array, wherein said off-die $V_R/V_W$-generator generates at least a read voltage and/or a write voltage different from a supply voltage;
- means for coupling said 3D-array die and said peripheral-circuit die;
- wherein the number of interconnect levels in said peripheral-circuit die is more than the number of interconnect levels in said 3D-array die, but substantially less than the number of back-end-of-line (BEOL) levels in said 3D-array die; said off-die $V_R/V_W$-generator is absent from said 3D-array die; and, said 3D-array die and said peripheral-circuit die are separate dice.

8. The memory according to claim 7, wherein each of said 3D-OTP cells comprises an antifuse layer.

9. The memory according to claim 7, wherein said 3D-array die and said peripheral-circuit die are located in a memory package, a memory module, a memory card, or a solid-state drive.

10. The memory according to claim 7, further comprising another 3D-array die including at least another 3D-OTP array, wherein said peripheral-circuit die comprises at least another portion of another off-die peripheral-circuit component for said another 3D-array die.

11. The memory according to claim 7, wherein said off-die $V_R/V_W$-generator is a read-voltage generator.

12. The memory according to claim 7, wherein said off-die $V_R/V_W$-generator is a write-voltage generator.

13. A discrete three-dimensional one-time-programmable memory (3D-OTP), comprising:
- a 3D-array die comprising at least a 3D-OTP array and an in-die peripheral-circuit component, wherein said 3D-OTP array comprises a plurality of vertically stacked 3D-OTP cells;
- a peripheral-circuit die comprising at least an off-die peripheral-circuit component including an off-die $V_R/V_W$-generator of said 3D-OTP array, wherein said off-die $V_R/V_W$-generator generates at least a read voltage and/or a write voltage different from a supply voltage;
- means for coupling said 3D-array die and said peripheral-circuit die;
- wherein said off-die peripheral-circuit component and said in-die peripheral-circuit component comprise different interconnect materials; said off-die $V_R/V_W$-generator is absent from said 3D-array die; and, said 3D-array die and said peripheral-circuit die are separate dice.

14. The memory according to claim 13, wherein said 3D-array die comprises high-temperature interconnect materials.

15. The memory according to claim 13, wherein said peripheral-circuit die comprises high-speed interconnect materials.

16. The memory according to claim 13, wherein each of said 3D-OTP cells comprises an antifuse layer.

17. The memory according to claim 13, wherein said 3D-array die and said peripheral-circuit die are located in a memory package, a memory module, a memory card, or a solid-state drive.

18. The memory according to claim 13, further comprising another 3D-array die including at least another 3D-OTP array, wherein said peripheral-circuit die comprises at least another portion of another off-die $V_R/V_W$-generator for said another 3D-array die.

19. The memory according to claim 13, wherein said off-die $V_R/V_W$-generator is a read-voltage generator.

20. The memory according to claim 13, wherein said off-die $V_R/V_W$-generator is a write-voltage generator.

* * * * *